United States Patent [19]

Kustedjo et al.

[11] 4,360,916
[45] Nov. 23, 1982

[54] METHOD AND APPARATUS FOR PROVIDING FOR TWO BITS-ERROR DETECTION AND CORRECTION

[75] Inventors: Simon Kustedjo, Kitchener; Kuen H. Mak, Mississauga, both of Canada

[73] Assignee: NCR Canada Ltd.-NCR Canada Ltee., Mississauga, Canada

[21] Appl. No.: 108,876

[22] Filed: Dec. 31, 1979

[51] Int. Cl.³ .............................................. G06F 11/10
[52] U.S. Cl. ........................................ 371/37; 371/38
[58] Field of Search ...................................... 371/37, 38

[56] References Cited

U.S. PATENT DOCUMENTS

| | | | |
|---|---|---|---|
| 3,303,463 | 2/1967 | Hamburgen | 371/53 |
| 3,418,629 | 12/1968 | Chien | 371/37 |
| 3,648,236 | 3/1972 | Burton | 371/37 |
| 3,685,014 | 8/1972 | Hsiao et al. | 371/37 |
| 3,917,935 | 11/1975 | Lazecki | 364/761 |
| 4,013,997 | 3/1977 | Treadwell | 371/38 |
| 4,064,483 | 12/1977 | Takezono et al. | 371/37 |
| 4,107,652 | 8/1978 | Tanahashi et al. | 371/37 |
| 4,117,458 | 9/1978 | Burghard et al. | 371/37 |
| 4,142,174 | 2/1979 | Chen et al. | 371/37 |
| 4,162,480 | 7/1979 | Berlekamp | 371/37 |

*Primary Examiner*—Charles E. Atkinson
*Attorney, Agent, or Firm*—J. T. Cavender; Albert L. Sessler, Jr.; Elmer Wargo

[57] ABSTRACT

A method and apparatus for detecting errors in a data word and for correcting up to two error bits therein through using Bose-Chaudhuri-Hocquenghem (BCH) codes. A Galois field table is arranged in an anti-log and log format to facilitate the calculation of certain values such as $$\frac{S_3}{S_1}$$

associated with the BCH codes.

16 Claims, 14 Drawing Figures

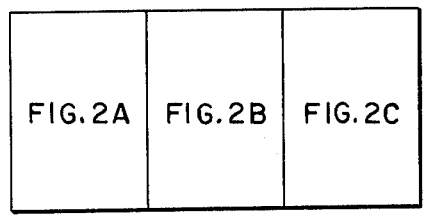
FIG. 2D
FIG. 2A
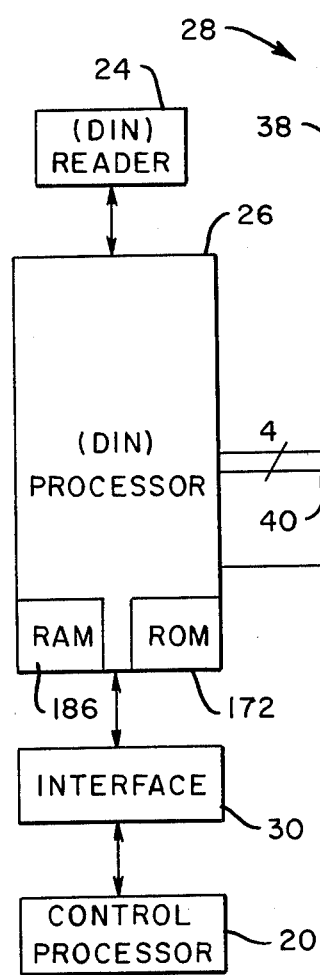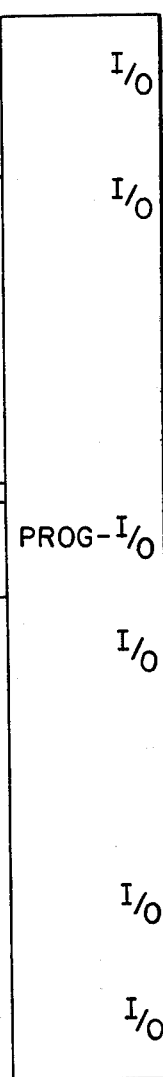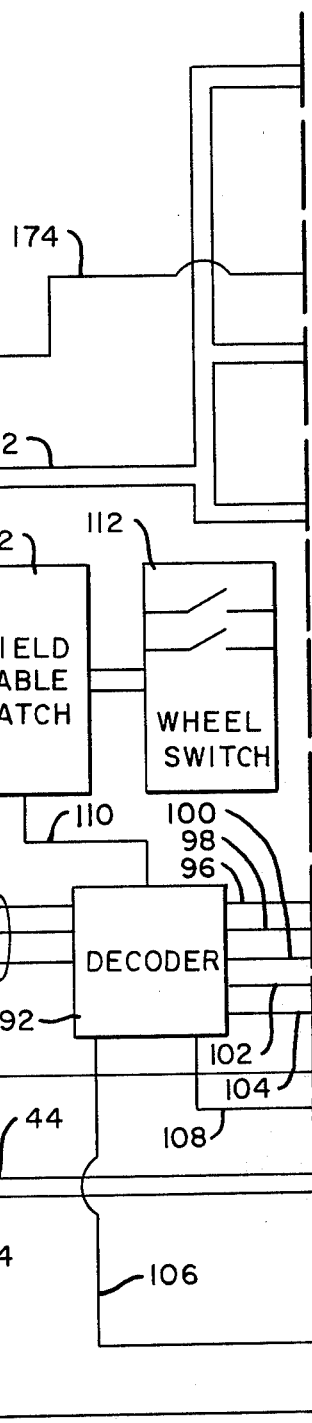

FIG. 10

| GALOIS FIELD TABLE #76 ||
|---|---|
| LOG | ANTI-LOG |
| 0<br>(000H)<br>[0380H] | 1<br>(01H) |
| 1<br>(0001H)<br>[0381H] | 2<br>(02H) |
| 2<br>(0002H)<br>[0382H] | 4<br>(04H) |
| ⋮ | ⋮ |
| 48<br>(30H)<br>[03B0H] | 116<br>(74H) |
| ⋮ | ⋮ |
| 96<br>(63H)<br>[03F3H] | 127<br>(7FH) |
| ⋮ | ⋮ |
| 127<br>(7FH)<br>[03FFH] | 1<br>(01H) |

FIG. 11

| GALOIS FIELD TABLE #74 ||
|---|---|
| ANTI-LOG ($S_1$) | LOG |
| 1<br>(001H)<br>[0301H] | 0<br>(00H) |
| 2<br>(002H)<br>[0302H] | 1<br>(01H) |
| ⋮ | ⋮ |
| 116<br>(74H)<br>[0374H] | 48<br>(30H) |
| ⋮ | ⋮ |
| 127<br>(37F)<br>[037FH] | 99<br>(63H) |

4,360,916

METHOD AND APPARATUS FOR PROVIDING FOR TWO BITS-ERROR DETECTION AND CORRECTION

BACKGROUND OF THE INVENTION

This invention relates to a method and apparatus for detecting errors in a data word and for correcting up to two error bits therein.

Numerous methods and codes have been developed for improving the accuracy of transmission and processing of data words. One of these methods and codes for correcting random errors in data words relates to the Bose-Chaudhuri-Hocquenghem codes, hereinafter called BCH codes.

A number of different procedures have been devised for decoding BCH codes as enumerated in U.S. Pat. No. 3,648,236.

Some of the problems associated with the implementation of BCH codes is that generally expensive hardware logic and extensive computer time are required. Generally, time consuming multiplication or division operations are necessary to implement the BCH codes.

SUMMARY OF THE INVENTION

This invention relates to a method and apparatus for detecting a predetermined number of errors in a data word or element and for correcting the predetermined number of errors. The data word or element includes a data message and the associated BCH codes. The apparatus of circuit includes first means for generating from said data elements, the $S_1$, $S_2$ and $S_3$ values associated with said BCH codes; second means including a processing means for calculating the quotient of $$\frac{S_3}{S_1}$$

wherein $S_3$ is considered as $\alpha^a$ and $S_1$ is considered as $\alpha^b$; said second means including a Galois field table being arranged in an anti-log and log format to enable said processing means to calculate said quotient by subtracting the log of $\alpha^b$ obtained from the Galois field table from the log of $\alpha^a$ obtained from the Galois field table to produce a resulting log which used to obtain a resulting anti-log value A from the Galois field table; and third means including said processing means for receiving said $S_1$, $S_2$, $S_3$ values and said anti-log value A and also for determining therefrom the locations of a predetermined number of errors (if any) in a said data element.

Also, according to this invention, the method of detecting errors in a data element including a data message and associated BCH codes, comprises the following steps:

(a) generating from said data elements the $S_1$, $S_2$ and $S_3$ values associated with said BCH codes;

(b) calculating the quotient of $$\frac{S_3}{S_1},$$

(wherein $S_3$ is considered as $\alpha^a$ and $S_1$ is considered as $\alpha^b$) by using a Galois field table which is arranged in an antilog and log format to enable a processing means to calculate the quotient by subtracting the log of $\alpha^b$ obtained from the table from the log of $\alpha^a$ obtained from the table to produce a resulting log which is used to obtain a resulting anti-log value A from the Galois field table;

(c) determining the number of errors within a data element by using the associated $S_1$, $S_2$ and $S_3$ values; and (d) using the $S_1$, $S_2$, $S_3$ values and the antilog value A for determining therefrom the locations of errors in a said data element.

A special coding scheme used in the data element contributes to an improved accuracy of reading the data elements.

This invention provides a fast, low-cost method and apparatus for providing error detection and correction.

These advantages and others will be more readily understood from the following description, claims, and drawing.

BRIEF DESCRIPTION OF THE DRAWING

FIGS. 2A through 2D, taken together show the decoder module shown in FIG. 1;

FIG. 10 is a diagrammatic chart showing the arrangement of a Galois Field table shown in FIG. 2B; and FIG. 11 is a diagrammatic chart showing the arrangement of a second Galois field table shown in FIG. 2B.

DETAILED DESCRIPTION OF THE INVENTION

The method and apparatus of this invention may be used, for example, in general data storage applications and digital data communication transmission; however, the particular embodiment selected to portray this invention relates to a document processing system.

Figure 1:
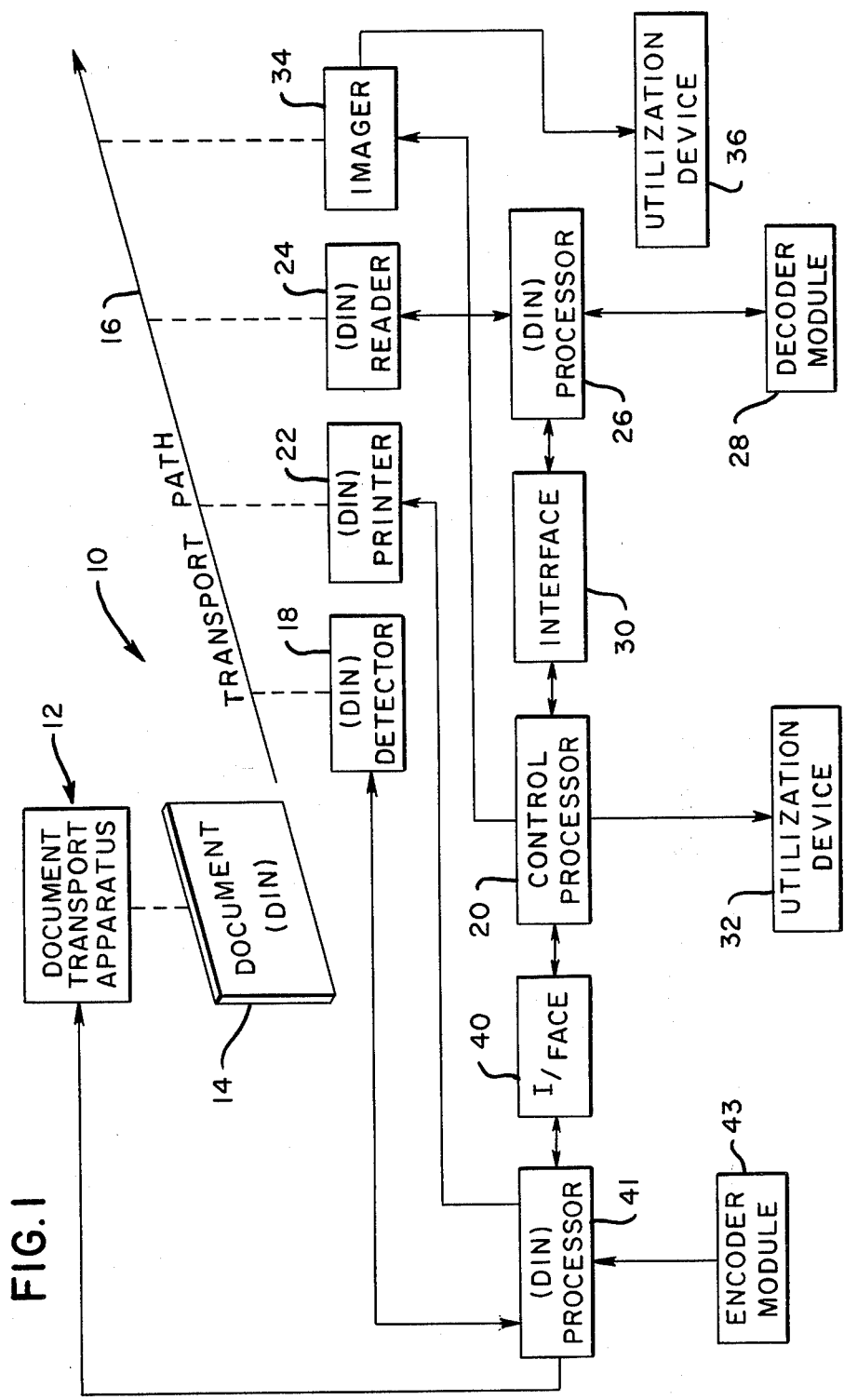
FIG. 1 is a general schematic diagram in block form showing an embodiment in which the method and apparatus of this invention may be used.

FIG. 1 is a general schematic diagram, in block form, showing a document processing system in which the method and apparatus of this invention may be used.

Basically, the document processing system designated generally as 10 in FIG. 1, is part of a banking system (not shown) in which certain documents such as checks and deposit slips are processed electronically.

The system 10 (FIG. 1) performs the general functions of assigning a document identification number (hereinafter referred to as DIN) to a document, checking on the accuracy of the DIN printed on the document, and forming a digitized image of the document being processed.

With this general background in mind, the system 10 in FIG. 1 includes a conventional document transport apparatus 12 (such as a check transport mechanism) for moving a document 14 along a transport path 16. As the document 14 is moved along the path 16, a DIN detector 18 is utilized to check for the presence of a DIN which may have been assigned previously; this is due to the fact that some documents such as checks, which are initially returned, for example, due to insufficient funds in the associated account, may be reentered into the system 10 to be processed again. Each document entered into the system 10 has only one DIN assigned to it; consequently, the DIN detector 18 avoids the assignment of two DIN's to one document 14. Assuming that there is no DIN on the document 14, the DIN detector 18 will report this fact to a DIN processor 41, which in turn will condition the DIN printer 22 to print a particular or unique DIN on the document 14 when the document 14 (as moved along the transport path 16 by the document transport apparatus 12) is in printing relationship with the DIN printer 22. The DIN printer 22 may be any conventional printer such as an ink jet printer, and the DIN may be printed in any convenient location on the document 14 and be printed in any conventional coding technique such as that employed by the currently popular bar codes.

After the DIN printer 22 prints a DIN on the document 14 (FIG. 1), the document 14 is moved into reading relationship with a DIN reader 24 which reads or verifies the DIN which has been printed on the document. The output of the DIN reader 24 is fed to a processor 26 which is operatively interfaced or connected with a decoder module 28 which detects errors in the DIN and corrects up to two errors therein. The processor 26 is also connected to the control processor 20 by an interface 30, and the control processor 20 may be connected to another part of the system 10 which is not important to an understanding of this invention and, consequently, is shown as a utilization device 32. After the document 14 is read by the DIN reader 24, it is brought into proximity with a conventional imager 34 which essentially forms a digitized image of the document 14 and forwards the digitized image to utilization device 36 which is not important to an understanding of this invention. After the document 14 is moved past the imager 34 along the transport path 16, it is deposited in a receptacle (not shown).

In the embodiment being described, the DIN is a 99 bit number although, of course, this invention may be used with data words of other lengths. Of the 99 bits, 85 bits are message or data bits and the remaining 14 bits are parity or check bits associated with the 85 message bits.

In the system 10 shown in FIG. 1 with the documents such as 14 being moved along the transport path 16 at a rate of approximately 2900 mm per second, it was difficult to provide an error detection and correction system with regard to the DIN's being read by the DIN reader 24 by the prior art methods involving BCH codes. Also, it was difficult to obtain an accuracy of reading the DIN to a correct reading percentage of more than 90%.

Under the present invention, the DIN processor 26 (FIG. 1) is efficiently utilized for reading and manipulating the bar codes associated with the DIN and for performing the decision making and protocol handling associated with the decoder module 28. In addition, a special technique for coding the DIN (to be later described herein) in conjunction with the new techniques and apparatus for handling the BCH codes provided by this invention improved the correct reading percentage of the DIN to approximately 99.9%.

Before proceeding with a detailed discussion of the handling of the BCH codes according to this invention, it would be useful to discuss these codes generally. In a BCH coding system in which more than two errors can be detected but only two errors can be corrected, the values of $S_1$, $S_2$ and $S_3$ are utilized. These S values represent known power sum symmetric functions associated with the BCH codes. Generally, under the prior art methods, the $S_1$, $S_2$, and $S_3$ are developed by combinational and sequential logic. The $S_1$ and $S_3$ values comprise the 14 parity or check bits associated with the 85 bits, thereby making up the 99 bit DIN in the example being described.

With regard to the $S_1$, $S_2$, and $S_3$ values of the BCD codes, the following rules apply when examining a data word:

(1) No errors are present when $S_1 = S_2 = S_3 = 0$;
(2) One error is present when $S_3 = S_1^3$, and $S_1 \neq 0$ and $S_3 \neq 0$;
(3) Two errors are present when $S_3 \neq S_1^3$, and $S_1 \neq 0$ and $S_3 \neq 0$; and
(4) More than two errors are present or a non-correctable situation exists when $S_1 = 0$, and $S_3 \neq 0$.

Once the number of errors in a data word has been determined, the particular locations of the errors therein are generally ascertained as follows:

(1) If one error is present, the following equation is used:

$$1 + \sigma_1 Z = 0 \qquad \text{Eq. 1}$$

This equation represents a Newton Identity which is part of the characteristics of the BCH codes. Continuing with the above, $$\sigma_1 = S_1, \text{ and}$$

$$1 + S_1 Z = 0, \text{ in which } Z \text{ is } \frac{1}{\sigma_1} = \frac{1}{S_1}.$$

By treating the above equation sequentially by $Z = \alpha^{-P}$ if, $S_1 = \alpha^P$, the particular error position (P) is identified. The bit in error is simply inverted and the associated data word is thereby corrected.

(2) If two errors are present, the following equation is used:

$$1 + \sigma_1 Z + \sigma_2 Z^2 = 0 \qquad \text{Eq. 2}$$

The above equation is in the usual quadratic form, and by solving this equation, two solutions are determined, and these two solutions provide the locations of the bits in the associated data word to be corrected. In the above equation, $$\sigma_2 = \frac{S_3}{S_1} + S_2.$$

Note: The + sign used in Equations 1 and 2 represents Exclusive OR functions sometimes written as $\oplus$. In the prior art methods, the value for $$\frac{S_3}{S_1}$$

is obtained through using sequential logic.

Under the present invention, the first step therein is to calculate the value of $$\frac{M(I)}{m_1(x)},$$

which is equal to residue 1, and is hereinafter referred to as $r_1$; wherein

M(I) = Message Polynomial.

$m_1(x)$ = 1st degree polynomial.

The value of $r_1$ is derived through sequential hardware which basically consists of Latches and Exclusive OR gates. The next step is to calculate the value of $$\frac{M(I)}{m_3x},$$

which is equal to residue 3, and is hereinafter referred to as $r_3$; wherein, $m_3$ = 3rd degree polynomial.

$m_3$ = 3rd degree polynomial.

The value of $r_3$ is derived through the use of sequential hardware as explained above. The next step is to calculate $S_3 = f(r_3)$; a processor is used to calculate this step. Let $S_1 = r_1$. This is inherent in BCH characteristics. A known relationship with BCD codes is $S_2 = (S_1)^2$. A treatment under this invention is to consider $S_1$ as alpha raised to some power P, as for example, $S_1 = \alpha^P$. If the expression $(S_2 = (S_1)^2)$ is written in logarithmic form, it becomes:

log $S_2$ = 2 log $S_1$; this property appears to be correct as long as one does not question the base value of the log. Earlier herein, it was stated that:

$$\sigma_2 = \frac{S_3}{S_1} + S_2. \text{ Let } A = \frac{S_3}{S_1}.$$

The above expression with regard to A can be considered as being in a general logarithmic format by stating that:

$$\log A = \log \frac{S_3}{S_1},$$

which in turn can be written as:

$$\log \frac{\alpha^a}{\alpha^b},$$

which is equal to log $\alpha^{a-b}$. (Assume $\alpha^a = S_3$; and $\alpha^b = S_1$.)

In other words, the log value of $\alpha^{a-b}$ has an antilog which is equal to A. This value of A is used in locating the positions of two errors, and will be described hereinafter.

Eq. 1 discussed earlier herein is:

$1 + \sigma_1 Z = 0$, or $$Z = \frac{1}{1} = -a,$$

with "a" being equal to the error location number for the single error in the DIN. The value of "a" above is utilized by the conventional Galois Field to obtain the location of the single bit error in the DIN.

From Eq. 2, when 2 errors are present in the DIN, it will be recalled that:

$1 + \sigma_1 Z + \sigma_2 Z^2 = 0$.

Using the technique earlier described herein, $1 = aZ + cZ^2$, and

I=0 to 127. If I=I+1, by incrementing I, then for $1 + \alpha^{a+I} + \alpha^{c+2I} = 0$, there will "be only two I values, namely $I_1$ and $I_2$" that satisfy $1 + \alpha^{a+I} + \alpha^{c+2I} = 0$. An iterative process (to be later described herein) is utilized to solve the previous equation for values of I, ranging from I=0 to 127. The position of the error #1 will be 127-$I_1$, and the position of the error #2 in the data word will be 127-$I_2$.

Figure 2B:
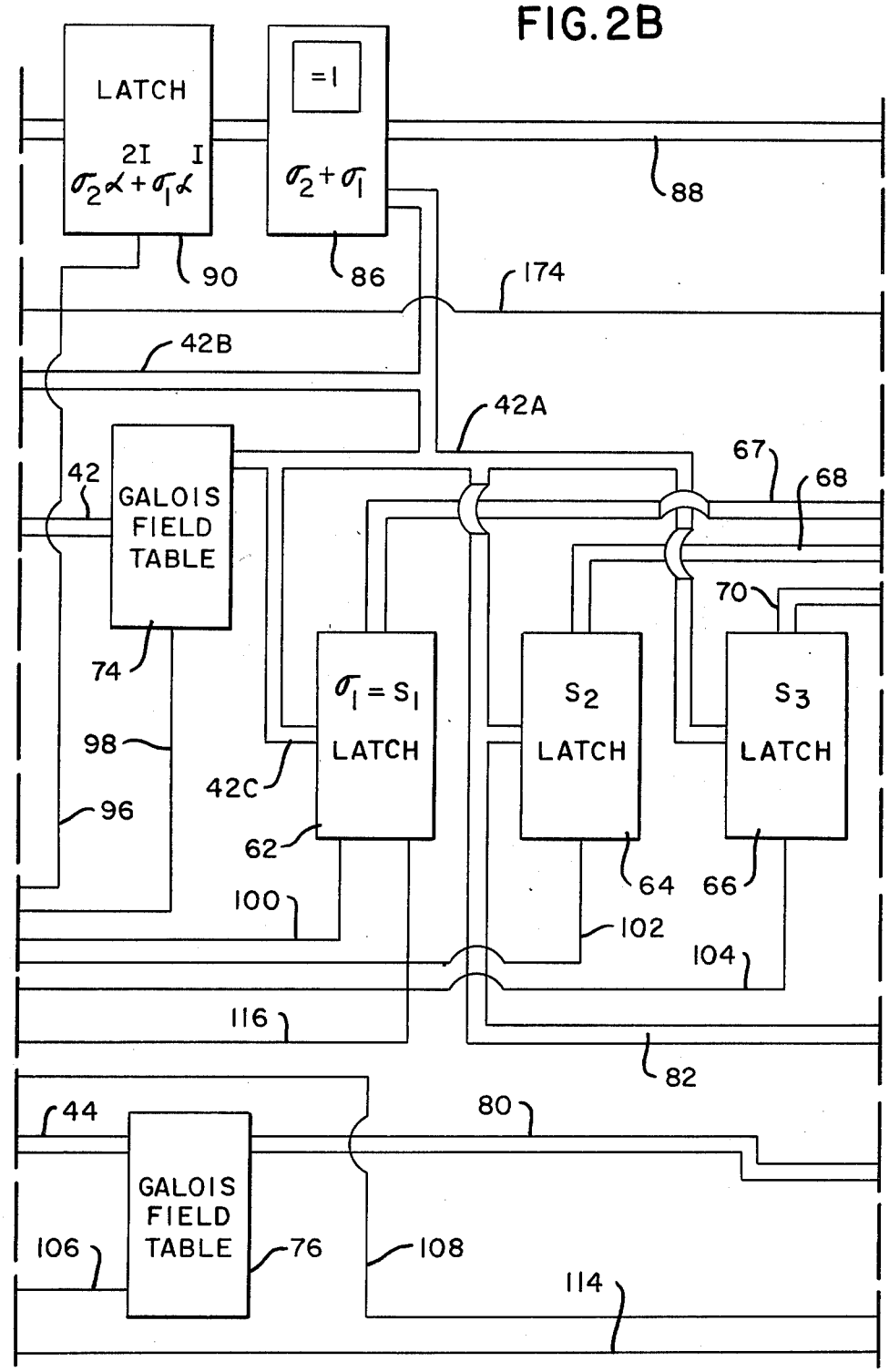
Figure 2C:
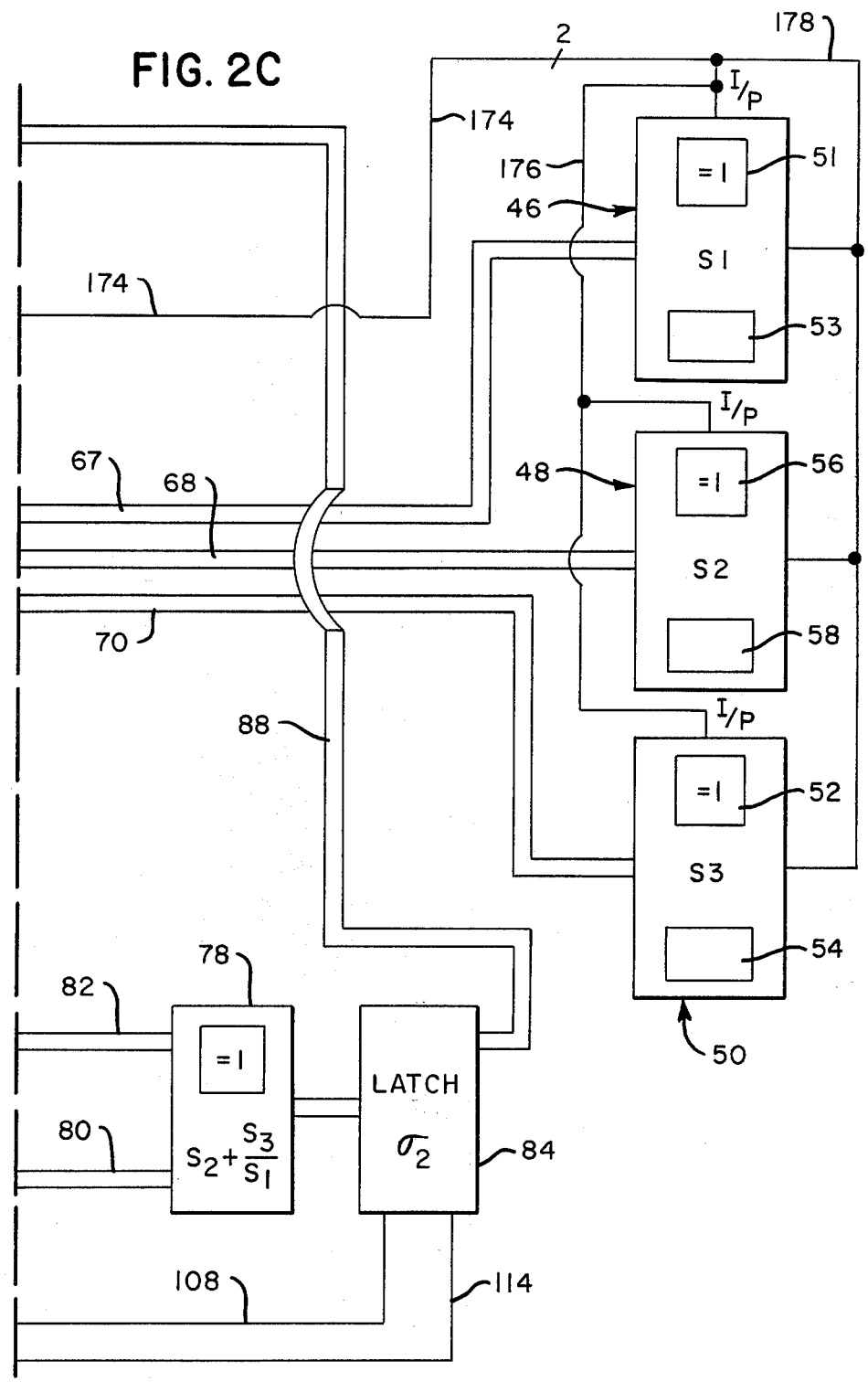

FIGS. 2A through 2C, taken together, show the decoder module 28 shown in block form in FIG. 1. The DIN processor 26 (FIG. 2A) may be a microprocessor such as #8048 which is manufactured by Intel Corporation. The DIN processor 26 is connected to a programmable I/O device 38 (which is conventional such as #8243 which is manufactured by Intel Corporation) by a 4 line bus 40. The device 38 has an eight-line input-/output port or bus 42 and an eight-line input/output port or bus 44 connected thereto. These buses 42 and 44 are conventional tri-state buses which are used to interconnect the various elements to be later described herein.

The DIN processor 26 (FIG. 2A) upon receiving a DIN to be checked, will condition the modules 46, 48, and 50 (FIG. 2C) so as to initiate the generation of the residue values $r_1$, $r_2$ and $r_3$ discussed earlier herein; these are the values associated with $S_1$, $S_2$, and $S_3$. Modules 46 and 50 are conventional division circuits employing Exclusive OR gates such as 51 and 52, respectively, and latches 53 and 54. Module 48 is a circuit (to be later described hereinafter) employing Exclusive OR gates 56 and a latch 58. Latches 62, 64, and 66 shown in FIG. 2B store the $S_1$, $S_2$, and $S_3$ values, respectively, therein. Latch 62 is connected to module 46 via a tri-state bus 67, latch 64 is connected to module 48 via a tri-state bus 68, and similarly, latch 66 is connected to module 50 via a tri-state bus 70. Each of the latches 62, 64, and 66 is connected to the tri-state bus 42 (FIG. 2A) via similar buses 42A and 42B. The module 72 (FIG. 2A) is connected to the bus 42 and a thumb wheel switch 74 (FIG. 2A). The module 72 (FIG. 2A) is a conventional latch which is used to latch the number of field table which is used for indicating the polynomial selected and also the position of the error which has to be detected and corrected.

Earlier herein, it was stated that a look up table was used for the log and antilog values of A as defined herein. Module or table 74 (FIG. 2B) is used as a look up table for obtaining the log, given the antilog of A as an address, and module or table 76 (FIG. 2B) is correspondingly used to obtain the antilog of A, given the log as an address. Modules 74 and 76 each comprise a half of a conventional PROM such as circuit #82S214 which is manufactured by Signetics, for example. The input to the module 74 is connected to the latches 62, 64, and 66 via the bus 42A, and the output of this module is connected to the input/output port of the I/O device 38 via the bus 42. The input to the module 76 is connected to the input/output port of the I/O device 38 via the bus 44, and the output of this module is connected to one set of input ports of the module 78 (FIG. 2C) via an eight conductor bus 80. The remaining set of input ports to the module 78 is connected to the output of latch 64 over an eight conductor bus 82. The module 78 consists of conventional Exclusive OR gates which perform the function of adding the value of A to the value of $S_2$ to obtain the value of $\sigma_2$ as discussed previously in relation to Equation 2. The output of the module 78, which is $\sigma_2$, is fed into the latch 84 whose output is fed into one set of inputs to the module 86 (FIG. 2B) over an 8 conductor bus 88. The remaining set of inputs to the module 86 is connected to the output of latch 62 via the buses 42A and 42C. The module 86 consists of conventional Exclusive OR gates and performs the function of adding $\sigma_2$ from latch 84 and $\sigma_1$ from latch 62. The output of module 86 (which output is the sum of $\sigma_2$ plus $\sigma_1$) is fed into the latch 90 whose output is fed into the input ports of the I/O device 38 via the bus 42.

The I/O device 38 (FIG. 2A) controls the various modules described in FIG. 2A through 2C by a decoder module 92 which is a conventional decoder such as circuit #7413B which is manufactured by Texas Instruments, Inc. In the embodiment described, three operating or selection ports (from the I/O device 38) marked by the circle 94 in FIG. 2A are utilized to select eight conductors or lines emanating from the decoder module 92. Line 96 from the decoder module 92 conditions the latch 90 (FIG. 2B), line 98 conditions the module 74, line 100 conditions the latch 62, line 102 conditions the latch 64, line 104 conditions the latch 66, line 106 conditions the module 76, line 108 conditions the latch 84 (FIG. 2C), and line 110 conditions the latch 72 (FIG. 2A); the output of a thumb wheel switch 112 is fed into this latch 72.

A clocking pulse from the I/O device 38 (FIG. 2A) is fed over a line 114 into the latch 84 (FIG. 2C) to clock the output ($\sigma_2$) of this latch to the module 86 (FIG. 2B) and similarly, a clocking pulse from the I/O device 38 is fed over a line 116 to clock the output ($\sigma_1$) from latch 62 (FIG. 2B) to the module 86 (FIG. 2B).

Before proceeding with a detailed description of the operation of the decoder module 28 shown in FIGS. 2A through 2C, it would be beneficial to discuss the specific nature of the DIN. When initially using the BCH codes as a check on the DIN being read by the DIN reader 24 (FIG. 1), it was discovered that a larger number of errors in reading was discovered when the data being read went from a binary one to a binary zero than when the data being read went from a binary zero to a binary one. Statistically, it would appear that the number of errors should be the same for transitions going from a binary one to a binary zero when compared to the reverse transitions, but for some unexplained reason, this was not so. Under the prior art BCH decoding techniques, it was possible that the so-called corrected code was in fact incorrect. This problem is obviated under the present invention by adopting a format to be described hereinafter.

Figure 3:
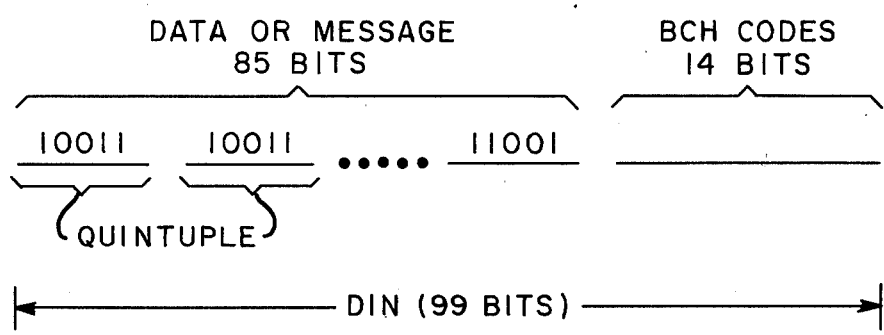
FIG. 3 is a schematic diagram of the format for a document identification number processed by the apparatus shown in FIG. 1.

FIG. 3 shows the format of a DIN which, in the embodiment being described, is comprised of 85 message bits and 14 bits of BCH codes to make a total of 99 bits as earlier stated. The data or message bits are arranged in 17 quintuples (groups of 5 bits each) as shown to make up the total of 85 bits. The 14 bits of BCH codes are arranged as shown. The coding scheme for the DIN was designed to limit the number of consecutive binary zeros in any quintuple to two. The following table shows the correlation between a conventional four bit binary code and the quintuple coding system used herein.

| 4 Bit Binary Code | Quintuple Coding |
|---|---|
| 0000 | 01001 |
| 0001 | 01010 |
| 0010 | 01011 |
| 0011 | 01101 |

-continued

| 4 Bit Binary Code | Quintuple Coding |
|---|---|
| 0100 | 01110 |
| 0101 | 01111 |
| 0110 | 10010 |
| 0111 | 10011 |
| 1000 | 10101 |
| 1001 | 10110 |
| 1010 | 10111 |
| 1011 | 11001 |
| 1100 | 11010 |
| 1101 | 11011 |
| 1110 | 11101 |
| 1111 | 11110 |

A conventional look-up table may be used to provide for accessing and a correlation between the above codes. Accordingly, when a corrected quintuple results in having three or more consecutive binary zeroes therein, it is apparent that the "corrected" DIN is not correct. One of the steps in analyzing the DIN for correctness is to count the number of consecutive binary zeros in a quintuple; this feature will be later discussed herein in relation to the operation of the decoder module 28.

Figure 4:
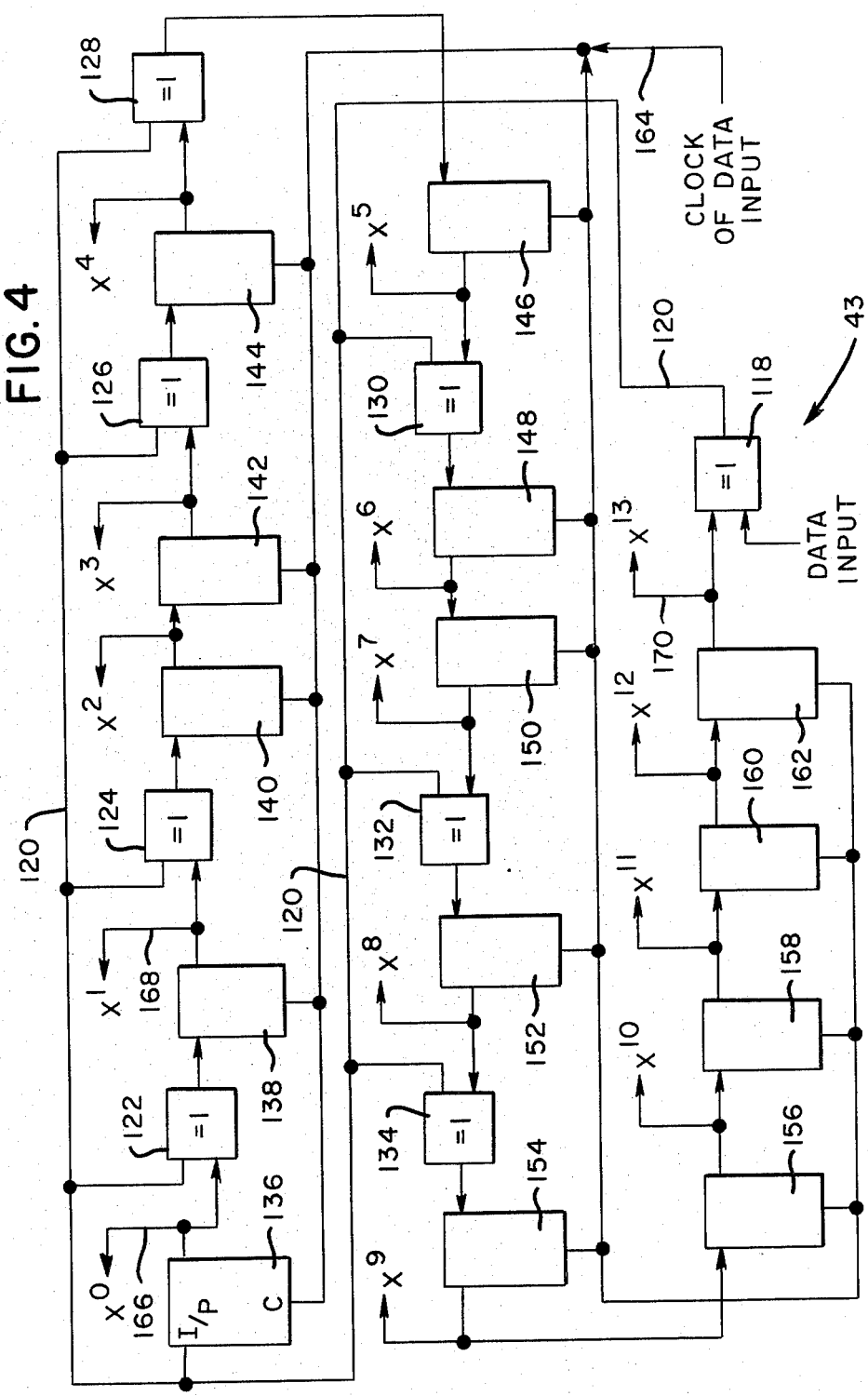
FIG. 4 is a schematic diagram showing details of the encoder module shown in FIG. 1.

With regard to the BCH codes shown in FIG. 3, the 14 bits associated therewith are developed in the encoder module 43 shown in FIG. 1, which module 43 is shown in more detail in FIG. 4. The 85 bits of data comprising the DIN are generated by a conventional number generator (not shown) and are fed serially into one input of an Exclusive OR gate 118 whose output is connected to a conductor 120. The encoder 43 is also comprised of a plurality of Exclusive OR gates 122, 124, 126, 128, 130, 132, and 134 and a plurality of latches 136, 138, 140, 142, 144, 146, 148, 150, 152, 154, 156, 158, 160, and 162. A clocking signal is fed over a conductor 164 to each of the latches 136–162; which in effect, performs the function of shift register. As each new bit of the 85 bits of the DIN is fed into gate 118, a clocking signal appears on conductor 164 to latch the data in the various latches. Each of the latches 136–162 has an output shown as an arrow on the output side thereof, as for example output 166 associated with latch 136 and output 168 associated with latch 138. The 14 bits associated with the BCH codes are obtained from the outputs of the latches (only after all 85 bits of data have been clocked into the encoder 43) with the first one of the check bits coming from the output 166, with the x or first power $(2)^1$ output coming from the output 168 and with the $x^{13}$ power coming from the output 170 of latch 162. The remaining powers like $x^2$ through $x^{12}$ are shown with the outputs associated with latches 140-160, respectively, also shown. After all 85 bits of data for a DIN have been encoded by the encoder 43, the associated 14 bits of BCH codes are taken from the outputs of the latches 136-162 and combined with the 85 bits to provide the 99 bits for the DIN shown in FIG. 3. The output 166 of latch 136 and the x powers such as $x^1$ through $x^{13}$ shown in FIG. 4 represent the coefficients of each one of the stages of a polynomial which is developed from the encoder 43 only after all 85 bits of data are clocked into the encoder 43. The coefficient of each one of the stages is represented by the following function g, wherein:

$$g(x)=1+x+x^2+x^4+x^5+x^6+x^8+x^9+x^{14}. \quad \text{Eq. 3.}$$

In the embodiment being described, a seven degree polynomial is adequate for coding purposes, i.e., the base 2 raised to the seventh power provides 128 different combinations. The 128 combinations are adequate as there are less than 128 bits in the DIN shown in FIG. 3 or FIG. 5. The BCH codes which are developed are cyclic codes in that they repeat after the first 128 combinations in the example being described. With regard to the g(x) function described earlier herein, the $x^{14}$ term therein is a way of expressing the cyclic nature of the codes in that the $x^{14}$ term represents the second cycle of codes ranging from the $x^0$ through the $x^{13}$ terms.

The 14 BCH codes (FIG. 3) which are developed by the encoder 43 (FIG. 4) are modified slightly to make them consistent with the quintuples of data shown in FIG. 3. In this regard, there is conventional software associated with the DIN processor 41 (FIG. 1) which inserts a binary "1" at every third position of the BCH codes including a binary "1" at the start of the code and a binary "1" at the end of the code. For example, for a portion of a 14 bit BCH code having the following format:

001001, the resulting BCH codes would have the following format with the binary "1"s having an asterisk over them being the binary "1"s which are added by the processor 41:

\* \* \*
100 110 101.

Figure 5:
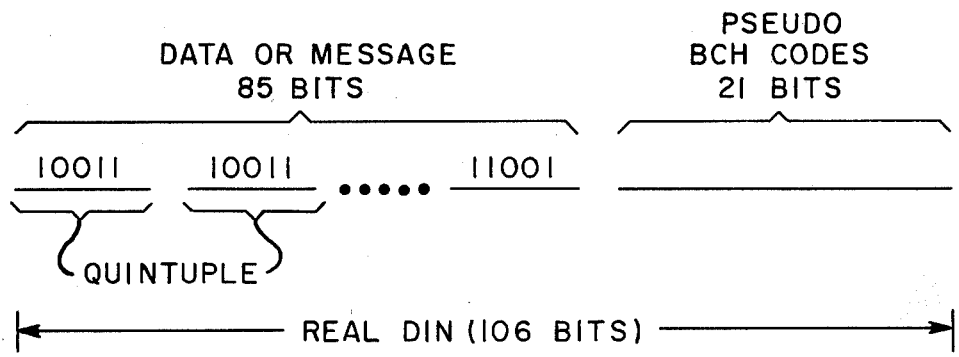
FIG. 5 is a schematic diagram of a format of a document identification number used with this invention.

The fourteen BCH codes which were developed by the encoder 43 becomes twenty one pseudo BCH codes by the addition of the binary "1"s as mentioned above. The message format then becomes:

LSB-21 bits parity-MSB; LSB-85 bits data-MSB; with LSB being the least significant bit, and MSB being the most significant bit. The total number of bits associated with the DIN which is applied by the printer 22 in FIG. 1 is 106 bits as shown in FIG. 5. As previously stated, the BCH codes have the binary "1"s added to them to make them consistent with the coding scheme assigned to the 85 bits of data in the message. In other words, if a quintuple consisting of BCH codes has more than two consecutive binary "0"s therein when checked, it is an indication that there is an error in the BCH code itself. From a statistical standpoint, 80% of the errors which occur in reading the DINs relate to reading the BCH codes themselves. That's the reason for changing the BCH codes themselves by adding the pseudo parity bits to provide a check on the accuracy of reading the BCH codes. The DIN which is printed on the document 14 (FIG. 1) is then read by the DIN reader 24.

After the reader 24 (FIG. 1) reads the DIN, the DIN processor 26 (FIGS. 1 and 2D) checks the DIN for two consecutive binary 0s, and if the DIN is OK, it eliminates the pseudo parity bits which were added. The processor 26 has a read only memory (ROM) 172 (FIG. 2A) associated therewith for handling conventional software for simply eliminating the first bit of the 21 pseudo parity bits and eliminating every third bit thereafter to end up with 14 BCH codes as discussed in relation to FIG. 3. The DIN, containing 85 message bits and 14 BCH codes making a total of 99 bits is then routed to the decoder module 28 for processing.

As previously stated, the $S_1$, $S_2$, and $S_3$ values or syndrome bytes are developed by the modules 46, 48, and 50, respectively shown in FIG. 2C. For a degree seven polynomial associated with the embodiment being described, a first polynomial $M_1$ (associated with Eq. 3) is:

$$M_1(x)=1+x^3+x^7.\qquad\text{Eq. 4}$$

The $S_1$ and $S_2$ syndrome bytes are calculated from Eq. 4 as will be described in more detail hereinafter.

Figure 6:
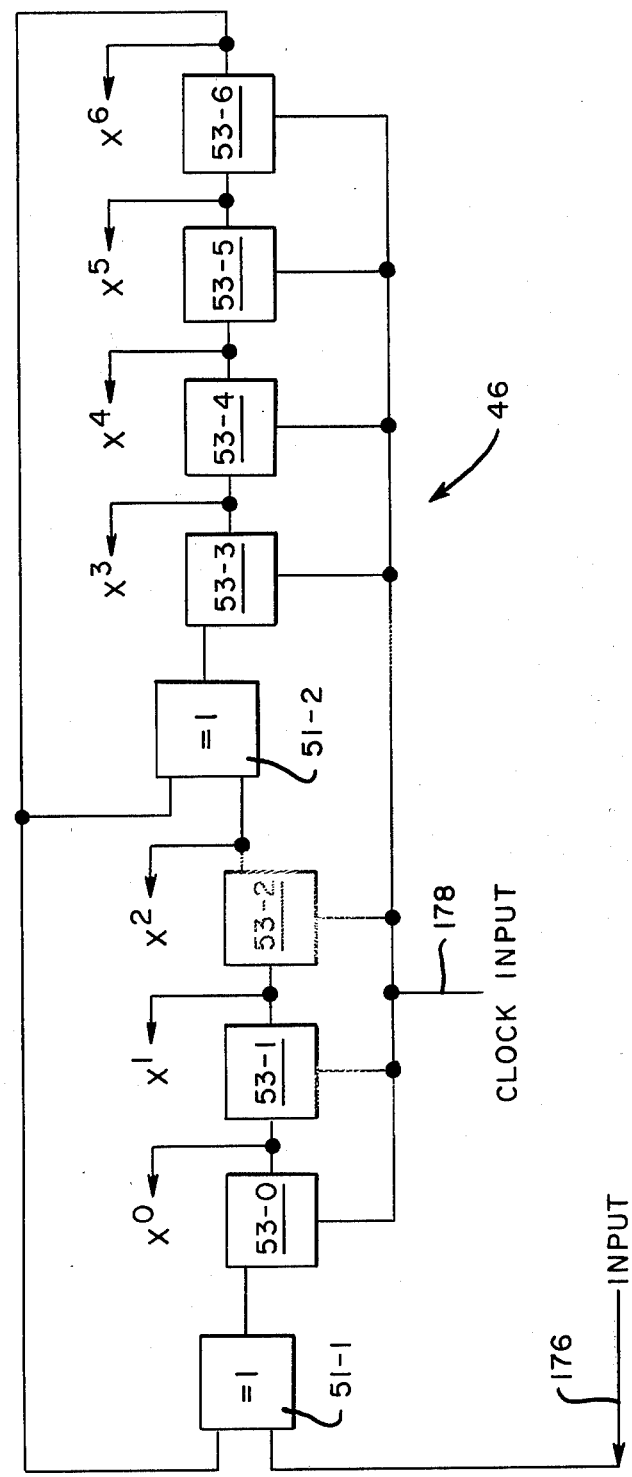
FIG. 6 is a schematic diagram showing more details of a decoder module $S_1$ shown in FIG. 2C.

FIG. 6 shows more details of the module 46 shown in FIG. 2C. The Exclusive OR gates 51 (FIG. 2C) are shown as gates 51-1 and 51-2 in FIG. 6, and similarly, the latches 53 (FIG. 2C) are shown as latches 53-0 through 53-6 as shown in FIG. 6 with the outputs of these latches being shown as $x^0$ through $x^6$, respectively. The module 46 has a data input line which is fed into the Exclusive OR gate 51-1 and also has a clock input which is fed into each of the latches 53-0 through 53-6 as shown. The DIN is fed serially into the module 46 via a 2 bit bus 174 (FIG. 2C) with the data input 176 and the clock 178 (FIG. 2C) being fed into each of the modules 46, 48, and 50. The outputs of the latches 53-0 through 53-6 change states as the data is fed into the module 46, and the entire output is read therefrom after the 99 bits of the DIN have been clocked into the module 46. The $S_1$ value is obtained by reading the $x^0$ through $x^6$ outputs shown in FIG. 6, i.e., $S_1$ = the output of $x^0$, $x^1$, $x^2$, $x^3$, $x^4$, $x^5$, and $x^6$. The $S_1$ value is then stored in the latch 62 shown in FIG. 2B.

Figure 7:
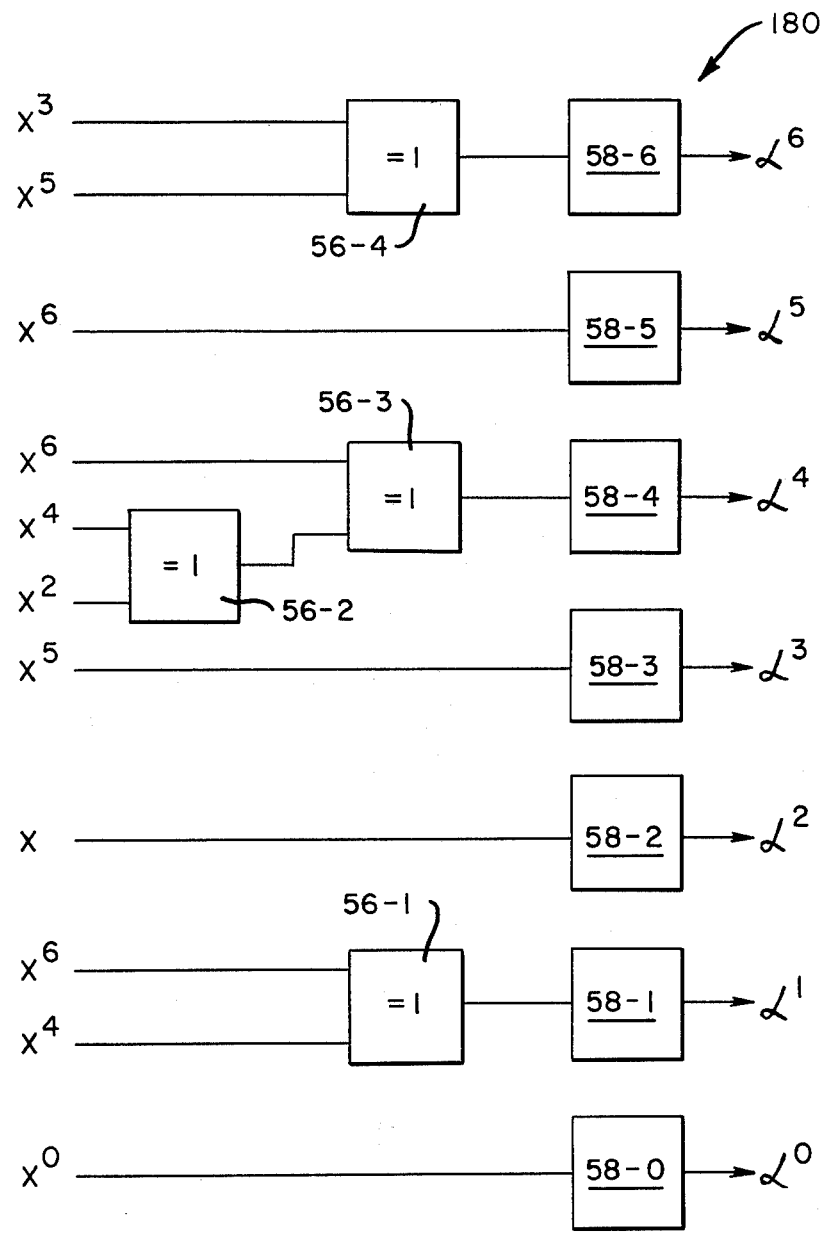
FIG. 7 is a schematic diagram showing more details of a decoder module $S_2$ shown in FIG. 2C.

At the same time that the $S_1$ value is being developed in module 46 (FIGS. 2C and 6), the $S_2$ value is developed in the module 48. The module 48 has the same circuit included therein for developing the $S_1$ value; however, in addition, it has the circuit 180 shown in FIG. 7 which circuit takes the $S_1$ value and decodes it via the Exclusive OR gates 56-1 through 56-4 and the latches 58-0 through 58-6. The $x^0$ through $x^6$ inputs to the circuit 180 are the corresponding values included in $S_1$, and the output of the circuit 180 is latched into the latches 58-0 through 58-6 which store the values called $\alpha^0$ through $\alpha^6$, respectively. The $S_2$ value is comprised of the outputs $\alpha^0$, $\alpha^1$, $\alpha^2$, $\alpha^3$, $\alpha^4$, $\alpha^5$, and $\alpha^6$ shown in FIG. 7. The $S_2$ value or byte is stored in the latch 64 shown in FIG. 2B.

Figure 8:
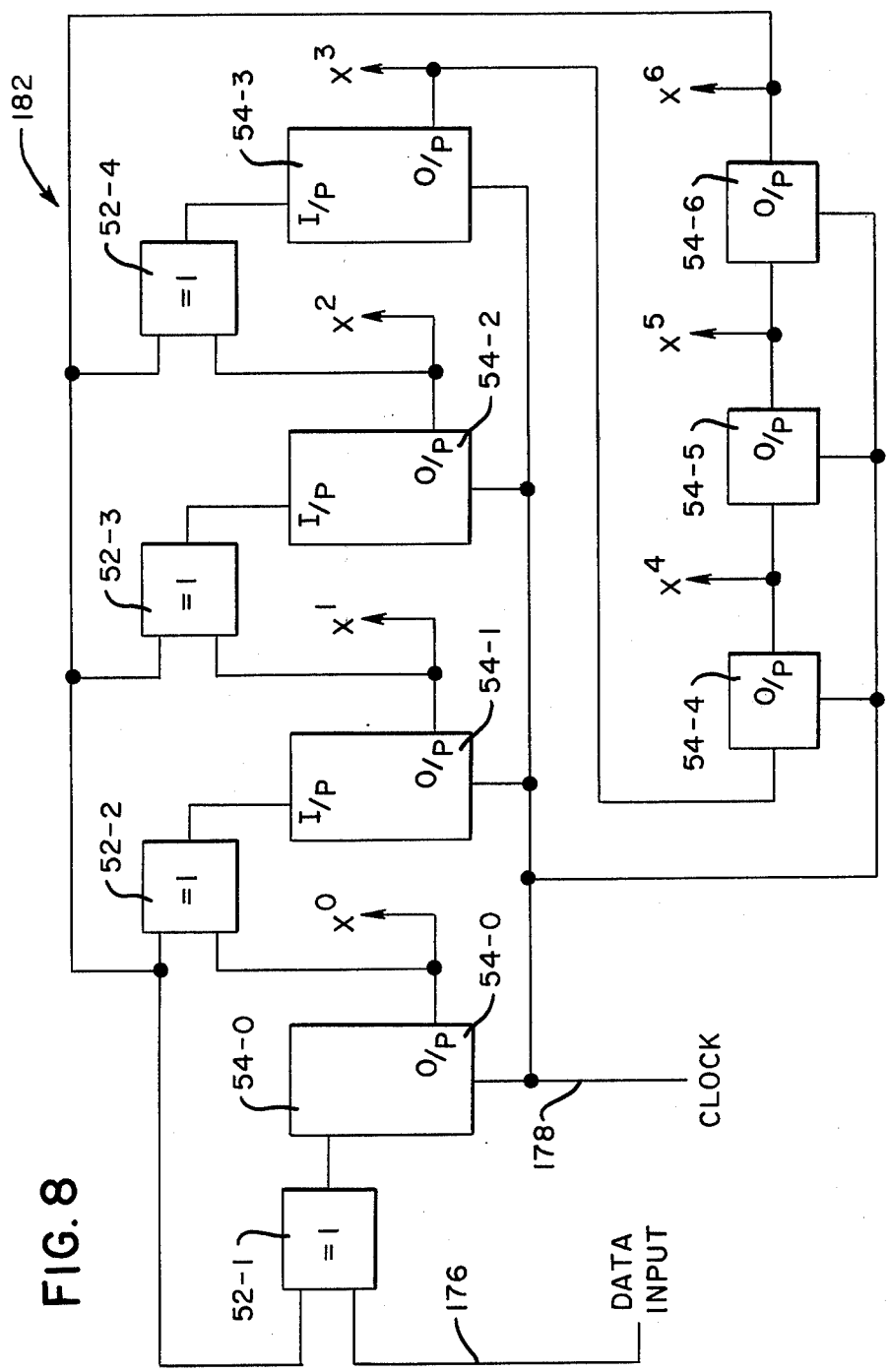
FIGS. 8 and 9 show more details of a decoder module $S_3$ shown in FIG. 2C.

At the same time that the $S_1$ and $S_2$ values are being developed, the $S_3$ value is developed in the module 50 shown in FIG. 2C. The module 50 is comprised of circuits 182 and 184 shown in FIGS. 8 and 9, respectively. The 99 bits of data from a DIN are fed into the circuit 182 (FIG. 8) via the conductor 176, and are clocked therein via a clocking pulse on conductor 178. The circuit 182 consists of a plurality of Exclusive OR gates 52-1 through 52-4 and a plurality of latches 54-0 through 54-6 as shown in FIG. 8. The outputs $x^0$ through $x^6$ are taken from the outputs of the latches 54-0 through 54-6, respectively, of the circuit 182 after all 99 data bits have been clocked into the circuit 182.

Figure 9:
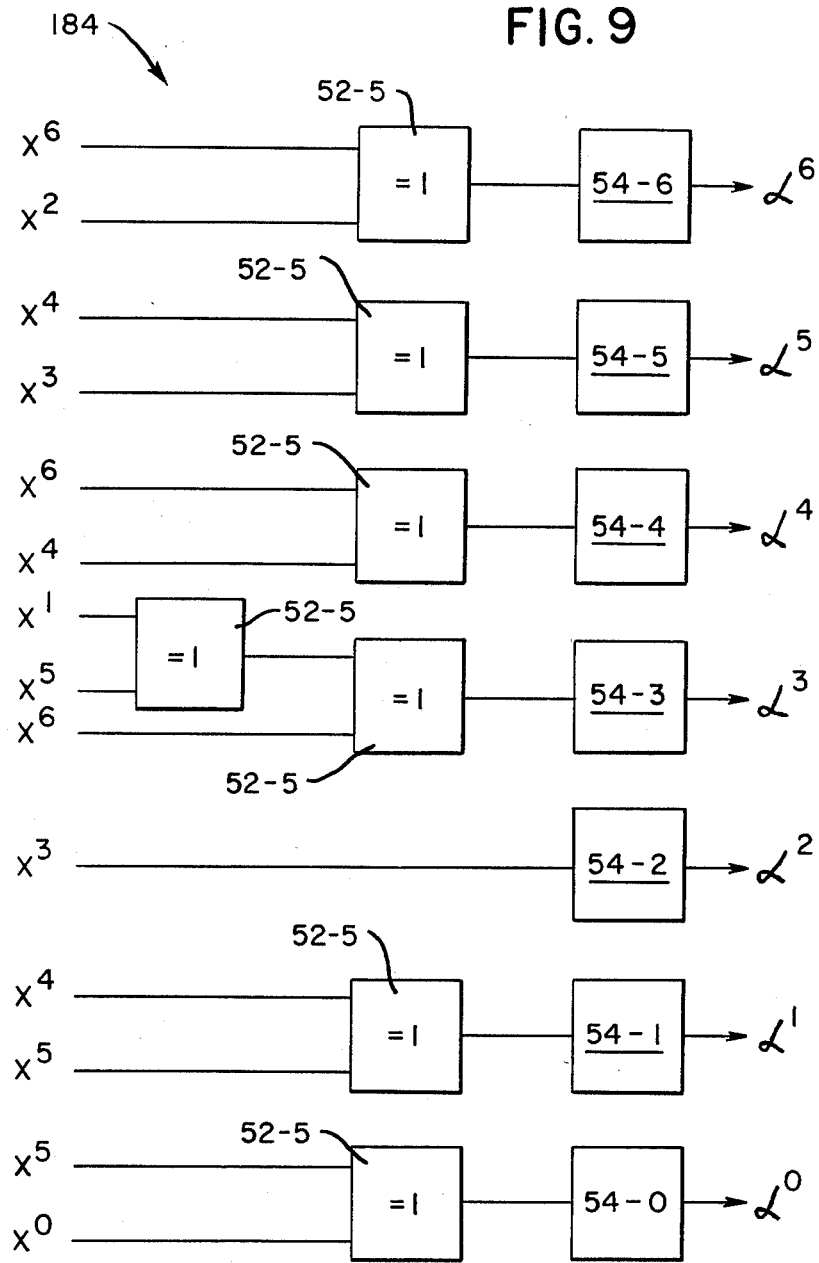

The $x^0$ through $x^6$ outputs from the circuit 182 (FIG. 8) are used as inputs to the circuit 184 shown in FIG. 9. The circuit 184 consists of a plurality of Exclusive OR gates 52-5 and latches 54-0 through 54-6 which are connected together as shown in FIG. 9. The outputs of latches 54-0 through 54-6 (FIG. 9) are considered $\alpha^0$ through $\alpha^6$, respectively, with $S_3$ equal to the output of $\alpha^0$, $\alpha^1$, $\alpha^2$, $\alpha^3$, $\alpha^4$, $\alpha^5$ and $\alpha^6$. The value of $S_3$ is then transferred (via bus 70 and clock 104) to the latch 66 (FIG. 2B) where it is stored.

After the $S_1$, $S_2$ and $S_3$ values or syndrome bytes are developed and stored in the latches 62, 64, and 66, respectively, they are examined for certain conditions by the processor 26. The processor 26 (FIG. 2A) reads the $S_1$, $S_2$, and $S_3$ values stored in latches 62, 64, and 66, respectively, and by conventional software associated with ROM 172 (FIG. 2A), evaluates the $S_1$, $S_2$, and $S_3$ values as follows:

(a) If $S_1 = S_2 = S_3 = 0$; then the number of errors $= 0$.

(b) If $S_3 \neq S_1 \neq 0$, and $S_3 = (S_1)^3$; then the number of errors $= 1$.

(c) If $S_3 \neq S_1 \neq 0$, and $S_3 \neq (S_1)^3$; then the number of errors $= 2$.

(d) If $S_1 \neq 0$, and $S_3 \neq 0$; then the number of errors is uncorrectable under the present embodiment being disclosed herein.

If, the processor 26 determines from line (a) above that no error exists in the particular DIN being read by the reader 24 (FIG. 1), then the next document 14 is fed along the transport path 16 to check on the associated DIN as just explained. If from line (d) above, more than two errors occurs, then an uncorrectable situation exists and the particular document 14 containing the uncorrectable errors is highlighted for special treatment and correction. If from lines (b) and (c) above, one or two errors exist in the 85 bits of data, then an error location process must be initiated to ascertain where in the 85 bits of data, the one or two errors occurs or occur. There are four separate, conventional, software routines associated with the DIN processor 26 and the ROM 172 (FIG. 2A) to handle the subsequent processing after the determination of the various error conditions associated with the (a), (b), (c), and (d) conditions previously mentioned.

As part of these routines, when one error has been determined, the $S_1$ value or syndrome is used to determine the particular location of the error within the 85 data bits or message in the example being described. From what has been discussed earlier herein, the $S_1$ value corresponds to alpha raised to some power P; consequently, the $S_1$ value represents an "antilog" value. The $S_1$, $S_2$, and $S_3$ values contain the coefficients of the associated polynomials. For example, the $S_1$ value is obtained by reading the $x^0$ through $x^6$ outputs shown in FIG. 6. Having the "antilog" value for $S_1$, the corresponding log can be obtained from table 74 (FIG. 2B). The table 74 is utiized to obtain the location of the single error, and the format of the table 74 (which represents a Galois Field) is shown in FIG. 11. The table 74 lists the antilog values of $S_1$ (as addresses) ranging from 0 through 127 and the associated error locations are listed under the column marked "Log" and are given in hexadecimal form in parenthesis. For example, if the $S_1$ syndrome has a value of 116, the corresponding error location of 30H or 48 can be read from the table 74. This indicates that the single error is located in bit #48 out of the 85 bits of data or message. The software routine, alluded to earlier herein and associated with the 1 error condition, transfers the $S_1$ value from latch 62 (FIG. 2B) to the table 74 via the bus 42C to obtain the single error location as described, and this error location is sent via the I/O device 38 to the processor 26. The processor 26 stores the entire DIN just read in a portion of a random access memory RAM 186 (FIG. 2A) associated with the processor, and the associated software routine is utilized to simply invert the single error bit which is bit #48 in the example being discussed. The corrected DIN (after being checked again) is then transferred through the interface 30 to the control processor 20 to the utilization device 32 (FIG. 1) or any other utilization device such as 36. Upon completion, the DIN for the next document 14 is read and processed.

When two errors are determined to be present in the DIN being read, the $S_3$ and $S_1$ values earlier discussed herein are utilized. From Eq. 2, the locations of the two errors were determined using the value of $\sigma_1$ (defined in association with Eq. 1) and the value of $\sigma_2$ (defined in association with Eq. 2. The value $\sigma_2$ is equal to:

$$\frac{S_3}{S_1} + S_2.$$

The $S_1$ and $S_3$ values are considered antilogs as previously explained; consequently, to perform the division of $S_3$ divided by $S_1$, the following steps are used. The $S_3$ value which is stored in latch 66 (FIG. 2B) is utilized as an address to the table 74 (FIG. 11) to obtain the log thereof. The log value obtained from table 74 is routed to the processor 26, as previously explained, where it is stored in RAM 186. Similarly, the $S_1$ value which is stored in latch 62 is utilized as an address to the table 74 to obtain the corresponding log thereof. The log value thus obtained is similarly routed to the processor 26 and stored in the RAM 186. The processor 26 then subtracts these log values, i.e., $\alpha^{a-b}$, wherein $S_3 = \alpha^a$, and $S_1 = \alpha^b$. The value $\alpha^{a-b}$ which is derived by the processor 26 (by subtraction) is considered a log value whose antilog is A. The log value of (a-b) is forwarded by the processor 26 to the table 76 (FIG. 2B) where the log value of (a-b) is used as an address to obtain the corresponding antilog value. The format of table 76 is shown in more detail in FIG. 10.

From table 76 (FIG. 2B), the antilog of $\alpha^{a-b}$ or A is forwarded to the module 78 via bus 80. The $S_2$ value, which is stored in latch 64 (FIG. 2B), is also routed into module 78 via the bus 82. The module 78 consists of Exclusive OR gates whose function it is to add together the $S_2$ value and the antilog A from the table 76

$$\left( \text{i.e.} \frac{S_3}{S_1} \right).$$

The output of the module 78 is $$S_2 + \frac{S_3}{S_1}$$

which output is also termed $\sigma_2$ and this output $\sigma_2$ is latched in latch 84 via a pulse occurring on conductor 114. It should be recalled that $\sigma_2$ is used in Eq. 2 for the purpose of locating the bit positions of the two errors in the associated 85 bit data word in the example described. The value of $\sigma_1$ (which is considered an antilog) is fed into the Exclusive OR gate 86 (via a control signal on conductor 100) under the control of software associated with the DIN processor 26, and similarly, the value of $\sigma_2$ is also fed (via a control signal on conductor 108) to the gate 86. It should be recalled that when the sum of $\sigma_1$ plus $\sigma_2$ is equal to 1, the solution of the roots of the associated quadratic equation may be found as discussed earlier herein.

At the first time that the $\sigma_1$ and $\sigma_2$ values are fed through the Exclusive OR gate 86 (FIG. 2B) the iteration or I value is equal to zero, and the value of the output of the gate 86 is stored in the latch 90. The iteration which is performed is: $\sigma_2 \alpha^{2I} + \sigma_1 \alpha^I$, wherein I has values ranging from 0 to 127. The $\sigma_1$ and $\sigma_2$ values which are initially stored in the latch 90 are routed through the table 74 to obtain the log values thereof which values are stored in the RAM 186 associated with the processor 26. When the iterative value is equal to 1, the value of 1 is added to the log value associated with $\sigma_1$ and 2 times the value of the iterative value (I=1 at this time) is added to the log value associated with $\sigma_2$ as previously explained. The newly determined log value of $\sigma_1$ is used as an address to the table 76 (to obtain the antilog value of $\sigma_1$ via the programmable I/O device 38) and the antilog value of $\sigma_1$ is returned over bus 44 via the device 38 and is then outputted over bus 42 to the Exclusive OR gate 86 (FIG. 2B). The log value of $\sigma_2$ (to which has been added 2 times the value of I) is then similarly routed to the table 76 to obtain the antilog value thereof, and is routed over bus 42 to the Exclusive OR gate 86 to determine whether or not the sum thereof is equal to 1. In the meanwhile the log values of $\sigma_1$ and $\sigma_2$, when the iterative value of I was equal to 1, are stored in the RAM 186 associated with the processor 26. If the values of $\sigma_1$ and $\sigma_2$ passing through the gate 86 do not equal 1, it means that the iterative procedure must be repeated for an iterative value of I equals 2 in the example being discussed; this process is repeated until the value of I equal 127 is obtained. When the sum of $\sigma_1$ plus $\sigma_2$ does equal 1 upon passing through the Exclusive OR gate 86, the particular iterative value of I (which is also stored in the RAM 186) is used to ascertain the locations of the two bits in the DIN which are in error. In this regard, there are certain values of the error locations which are ignored. For example, if the output of the Exclusive OR gate 86 equals 1 when I is equal to zero, the location of the first error is equal to:

127-I$_1$ or
127-0=127.

In this case, 127 is a meaningless value or is a don't care value because the DIN (FIG. 5) used in this example contains only 106 bits. In order to provide a check on a DIN having 106 bits, it was necessary to employ degree seven polynomials (i.e. $2^7=128$) with the BCH codes; consequently, those indications of errors for bits 107 through 127 are meaningless in the example being discussed. If the iterative value of I were 20 when the value of $\sigma_1$ plus $\sigma_2$ equals 1 as previously discussed, then the second error would be found by:

127-I$_2$, or
127-(20×2)=87.

In this situation, the processor 26 would simply invert bit #87 out of the 106 bits of the DIN for I$_2$. For I$_1$=20, the first error would be found by:

127-I$_1$, or
127-20=107.

In this situation, because there is no bit #107 in the DIN (which has 106 bits), there would be no change therein as far as I$_1$ is concerned.

After the first and second errors are corrected as outlined above, the corrected DIN is then rerouted to the modules 46, 48, and 52 in FIG. 2C for developing the S$_1$, S$_2$, and S$_3$ values, respectively, as previously discussed. After these values are developed, the S$_1$ and S$_2$ values are examined by the processor 26, and if S$_1$=S$_2$=0, then no error exists in the DIN, and accordingly, the next document 14 (FIG. 1) can be moved to the reader 24 to have its DIN read and checked as described. If the "corrected" DIN still has an error detected therein, it is manually processed to correct the problem.

FIGS. 10 and 11 diagrammatically show the arrangement of data included in the Galois field tables 76 and 74, respectively, shown in FIG. 2B. Complete lists of the data included in the tables 74 and 76 are included hereinafter and are shown as List #1 and List #2, respectively. The values shown in Lists #1 and #2 for tables 74 and 76 are given in hexadecimal codes. The left-most columns of Lists #1 and #2 list the addresses for these tables. The index of the table 74 (List #1) should be interpreted as being the indicated address (in the left-most column) minus 0300H (hexadecimal code). Similarly, the table 76 (List #2) should be interpreted as being the indicated address minus 0380H (Hexadecimal code). It should be recalled that tables 74 and 76 are each physically located in one half of the same conventional PROM.

In order to show the correlation between the Lists #1 and #2 and their associated layouts in FIGS. 11 and 10, respectively, an example will be given. The entries in FIGS. 10 and 11 may have up to three designations for each entry shown therein. The top entries are the usual decimal numbers expressed in the base 10; the entries which are enclosed in parenthesis are given in hexadecimal code; and the entries which are enclosed in brackets correspond to the addresses of the tables and are given in hexadecimal code. For example, the 116th listing for table 74 (List #1) as expressed by address 0374H in the table, is shown as 30H (underlined) in List #1 and FIG. 11. Correspondingly, the 48th entry in List #2 having an address of O3BOH is shown as having a value of 74H (in hexadecimal code) in List #2 and FIG. 10. The remaining values can be easily obtained from the following Lists #1 and #2.

LIST #1
GALOIS FIELD TABLE #74

| ANTI-LOG | | | | | LOG | | | | | | | | | |
|---|---|---|---|---|---|---|---|---|---|---|---|---|---|---|
| 0300H=00H | 00H | 01H | 1FH | 02H | 3FH | 20H | 67H | 03H | 07H | 3FH | 0FH | 21H | 54H | 68H | 5DH |
| 0310H=04H | 7CH | 08H | 79H | 40H | 4FH | 10H | 73H | 22H | 0BH | 55H | 26H | 69H | 2EH | 5EH | 33H |
| 0320H=05H | 52H | 7DH | 3CH | 09H | 2CH | 7AH | 4DH | 41H | 43H | 50H | 2AH | 11H | 45H | 74H | 17H |
| 0330H=23H | 76H | 0CH | 1CH | 56H | 19H | 27H | 39H | 6AH | 13H | 2FH | 59H | 5FH | 47H | 34H | 6EH |
| 0340H=06H | 0EH | 53H | 5CH | 7EH | 1EH | 3DH | 66H | 0AH | 25H | 2DH | 32H | 7BH | 78H | 4EH | 72H |
| 0350H=42H | 29H | 44H | 16H | 51H | 3BH | 2BH | 4CH | 12H | 58H | 46H | 6DH | 75H | 1BH | 18H | 38H |
| 0360H=24H | 31H | 77H | 71H | 0DH | 5BH | 1DH | 65H | 57H | 6CH | 1AH | 37H | 28H | 15H | 3AH | 4BH |
| 0370H=6BH | 36H | 14H | 4AH | 30H | 70H | 5AH | 64H | 60H | 61H | 48H | 62H | 35H | 49H | 6FH | 63H |

| | | | | | LIST #2 GALOIS FIELD TABLE #76 | | | | | | | | | | |
|---|---|---|---|---|---|---|---|---|---|---|---|---|---|---|---|
| LOG | | | | | ANTILOG | | | | | | | | | | |
| 0380H=01H | 02H | 04H | 08H | 10H | 20H | 40H | 09H | 12H | 24H | 48H | 19H | 32H | 64H | 41H | 0BH |
| 0390H=16H | 2CH | 58H | 39H | 72H | 6DH | 53H | 2FH | 5EH | 35H | 6AH | 5DH | 33H | 66H | 45H | 03H |
| 03A0H=06H | 0CH | 18H | 30H | 60H | 49H | 1BH | 36H | 60H | 51H | 2BH | 56H | 25H | 4AH | 1DH | 3AH |
| 03B0H=74H | 61H | 4BH | 1FH | 3EH | 7CH | 71H | 6BH | 5FH | 37H | 6EH | 55H | 23H | 46H | 05H | 0AH |
| 03C0H=14H | 28H | 50H | 29H | 52H | 2DH | 5AH | 3DH | 7AH | 7DH | 73H | 6FH | 57H | 27H | 4EH | 15H |
| 03D0H=2AH | 54H | 21H | 42H | 0DH | 1AH | 34H | 68H | 59H | 3BH | 76H | 65H | 43H | 0FH | 1EH | 3CH |
| 03E0H=78H | 79H | 7BH | 7FH | 77H | 67H | 47H | 07H | 0EH | 1CH | 38H | 70H | 69H | 5BH | 3FH | 7EH |
| 03F0H=75H | 63H | 4FH | 17H | 2EH | 5CH | 31H | 62H | 4DH | 13H | 26H | 4CH | 11H | 22H | 44H | 01H |

Earlier herein it was stated that the latch 72 (FIG. 2A) contains the degree polynomial which is required for processing the DINs as discussed herein. In the embodiment described herein, the degree selected was seven, i.e., $2^7$ is equal to 128 combinations, to cover a DIN having 106 bits therein. If the DIN were to have 64 bits therein, a degree of 6 or $2^6$ would be adequate for processing as described herein. The latch 72 accordingly contains the number of errors to be detected and the degree polynomial to be used to enable the processor 26 to ascertain, for example, the number of iterations to be employed, i.e. 128 for a seventh degree polynomials, 64 for a sixth degree polynomials, etc. Another feature of the switch 112 and the latch 72 (FIG. 2A) is that it provides flexibility to the decoder module 28. For example, if a higher degree of accuracy is desired, the decoder module 28 can be varied to detect and correct 3 or 4 errors, for example. Naturally, additional Galois field tables like 74 and 76 would have to be prepared for the higher number of errors to be corrected, and conventional selection circuitry (not shown) responding to the data in the latch 72 would be utilized as previously described.

The method of detecting and correcting up to two errors as described in relation to module 28, can be expanded for any number of errors by solving the following equation:

$$Ex = x^t + x^{t-1}\sigma_1 + x^{t-2}\sigma_2 + \ldots$$

By solving for Newton Identities, the following equalities are used:

$\sigma_1 - S_1 = 0$,
$S_3 - \sigma_1 S_2 + \sigma_2 S_1 - 3\sigma_3 = 0$, and
$S_5 - \sigma_1 S_4 + \sigma_2 S_3 - \sigma_3 S_2 + \sigma_4 S_1 - S\sigma_5 = 0$.

In the determination of three errors, for example, the values of $S_1$, $S_2$, $S_3$, $\sigma_1$ and $\sigma_2$ are calculated from the previous identities as discussed earlier herein, and then:

$$\sigma_3 = \frac{S_3 - \sigma_1 S_2 + \sigma_2 S_1}{3}.$$

The above equation is then solved for the number of errors (t) as follows:

for $t=1$: $x = x + \sigma_1$,
for $t=2$: $x = x^2 + \sigma_1 x + \sigma_2$, and
for $t=3$: $x = x^3 + \sigma_1 S^2 + \sigma_2 + \sigma_3$.

The associated Chien searches for the various error states (t) are:

for $t=1$: $\Sigma Z = 1 + \sigma_1 Z = 0$,
for $t=2$: $\Sigma Z = 1 + \sigma_1 Z + \sigma_2 Z^2 = 0$, and
for $t=3$: $\Sigma Z = 1 + \sigma_1 Z + \sigma_2 Z^2 + \sigma_3 Z^3 = 0$.

The solutions of the above conditions for $t=1, 2,$ and 3 can be done by iteration as previously explained.

In determining the number of errors, the following applies:

(a) If no error exists, then $S_1 = S_2 = S_3 = 0$;
(b) If one error exists, then $S_3 = (S_1)^3$;
(c) If two and three errors exist, then $(S_1)^3 + S_3 \neq \phi$; and
(d) If an uncorrectable number of errors exists, then $S_1 = 0 S_3 \neq 0 \sigma_2 = \infty \sigma_3 = \infty$.

In other words, an uncorrectable number of errors exists if the roots are indeterminable.

The determination of the first and second errors (when three errors exist) is done as previously explained herein.

The determination of the third or higher error is done by using the following general equation, which is:

$$\Sigma x = x^t + x^{t-1}\sigma_1 + x^{t-2}\sigma_2 + \ldots$$

Utilizing the techniques discussed herein, the syndromes such as $S_1$, $S_2$ and $S_3$ can be calculated. For example, the $S_3$ syndrome may be calculated from the following Newton identity:

$S_3 - \sigma_1 S_2 + \sigma_2 S_1 - 3\sigma_3 = 0$.

We claim:

1. A circuit for use with data elements, with each data element including a data message and associated BCH codes, comprising:
   first means for generating from said data elements, the $S_1$, $S_2$ and $S_3$ values associated with said BCH codes;
   second means including a processing means for calculating the quotient of $$\frac{S_3}{S_1},$$

wherein $S_3$ is considered as $\alpha^a$ and $S_1$ is considered as $\alpha^b$; said second means including a Galois field table being arranged in an anti-log and log format to enable said processing means to calculate said quotient by subtracting the log of $\alpha^b$ obtained from said Galois field table from the log of $\alpha^a$ obtained from said Galois field table to produce a resulting log which is used to obtain a resulting anti-log value A from said Galois field table; and
   third means including said processing means for receiving said $S_1$, $S_2$, $S_3$ values and said anti-log value A and also for determining therefrom the locations of a predetermined number of errors (if any) in a said data element.

2. The circuit as claimed in claim 1 in which said Galois field table is comprised of first and second tables, wherein said first table has anti-logs as addresses with the corresponding logs being included at said addresses therein, and wherein said second table has said logs as addresses with the corresponding said anti-logs being included at said last named addresses.

3. The circuit as claimed in claim 2 in which said anti-logs correspond to the coefficients of the polynomials associated with said $S_1$, $S_2$ and $S_3$ values.

4. The circuit as claimed in claim 3 in which said third means includes latches for storing said $S_1$, $S_2$ and $S_3$ values as generated from said first means.

5. The circuit as claimed in claim 4 in which said third means has means including said processing means for evaluating said $S_1$, $S_2$ and $S_3$ values received from said latches for determining whether or not no error, 1 error, 2 errors, or more than 2 errors exist in a said data element.

6. The circuit as claimed in claim 5 wherein said $S_1$ value is used as an address for said first table when 1 error exists in a said data element to obtain the corresponding log which indicates the particular bit position within said data element which is in error, and in which said third means further includes means for inverting the bit in said particular bit position within said data element to provide a corrected data element.

7. The circuit as claimed in claim 6 in which said third means includes means for Exclusive ORing said anti-log value A and said $S_2$ value for generating a value $\sigma_2$ when two errors exist in a said data element, and in which said third means also includes second means for Exclusive ORing said value $\sigma_2$ with a value $\sigma_1$, wherein $\sigma_1$ is equal to said $S_1$ value and in which said third means also includes a second latch for storing said $\sigma_2 + \sigma_1$ value from said second Exclusive ORing means;

said third means also having means including said processing means for performing an iteration according to: $\sigma_2 \alpha^{2I} + \sigma_1 \alpha^I$ in conjunction with said $\sigma_2 + \sigma_1$ values in said second latch, wherein I is an iterative value ranging from 0 through a predetermined number corresponding to a number of errors to be detected, and wherein said two errors may be found when said $\sigma_2 + \sigma_1$ value in said second latch is equal to one; and said third means also having means including said processing means for determining the locations of said two errors when said $\sigma_2 + \sigma_1$ value is equal to one and also for correcting the associated bits in said data element.

8. The circuit as claimed in claim 7 in which each said data element is comprised of a plurality of quintuples, with said quintuples having binary patterns wherein a binary pattern having more than two predetermined consecutive binary bits within a quintuple is considered an error.

9. The circuit as claimed in claim 8 in which said two predetermined consecutive bits are binary 0's.

10. The circuit as claimed in claim 9 in which said BCH codes for an associated data message contain a predetermined number of binary bits, and said circuit further includes means for inserting binary "1's" at predetermined locations in said BCH codes to produce pseudo BCH codes for each said data element so as to make said pseudo BCH codes consistent with said quintuples whereby a bit pattern having more than two consecutive binary 0's within a quintuple of said pseudo BCH codes is indicative of an error when said data element including said data message and said pseudo BCH codes is subsequently read.

11. The circuit as claimed in claim 1 in which each said data element is comprised of a plurality of quintuples, with said quintuples having binary patterns wherein a binary pattern having more than two predetermined consecutive binary bits within a quintuple is considered an error.

12. The circuit as claimed in claim 11 in which said two predetermined consecutive bits are binary 0's.

13. An apparatus comprising:
means for generating data messages whereby each data message is comprised of a plurality of quintuples, with said quintuples having binary bit patterns, wherein a binary bit pattern having more than two predetermined consecutive binary bits of a first kind within a quintuple is considered an error;
means for generating BCH codes associated with said data messages;
means for inserting binary bits of a second kind at predetermined locations in said BCH codes to produce pseudo BCH codes for each said data message so as to make said pseudo BCH codes consistent with said quintuples whereby a bit pattern having more than two consecutive binary bits of said first kind within a quintuple of said pseudo BCH codes is indicative of an error when said pseudo BCH codes are subsequently read;
means for reading said data messages and associated pseudo BCH codes; and
means for checking on the accuracy of the data messages and associated pseudo BCH codes;
said checking means comprising:
first means including a processor means for checking said pseudo BCH codes to determine whether an error has occurred in the reading of said data messages and pseudo BCH codes as evidenced by finding more than two consecutive binary bits of said first kind within a quintuple of said pseudo BCH codes;
second means including said processor means for eliminating said binary bits of said second kind from said pseudo BCH codes to obtain said BCH codes for the associated data messages to produce data elements, with each data element including a said data message and its associated BCH codes;
third means for generating from said data elements, the $S_1$, $S_2$ and $S_3$ values associated with said BCH codes;
fourth means including said processing means for calculating the quotient of $$\frac{S_3}{S_1},$$

wherein $S_3$ is considered as $\alpha^a$ and $S_1$ is considered as $\alpha^b$;
said fourth means including a Galois field table being arranged in an anti-log and log format to enable said processing means to calculate said quotient by subtracting the log of $\alpha^b$ obtained from said Galois field table from the log of $\alpha^a$ obtained from said Galois field table to produce a resulting log which is used to obtain a resulting anti-log value A from said Galois field table; and
fifth means including said processing means for receiving said $S_1$, $S_2$, $S_3$ values and said anti-log value A and also for determining therefrom the locations of a predetermined number of errors (if any) in a said data element.

14. The circuit as claimed in claim 13 in which said Galois field table is comprised of first and second tables, wherein said first table has anti-logs as addresses with the corresponding logs being included at said addresses therein, and wherein said second table has said logs as addresses with the corresponding said anti-logs being included at said last named addresses.

15. A method of detecting errors in a data element including a data message and associated BCH codes, comprising:
   (a) generating from said data elements the $S_1$, $S_2$ and $S_3$ values associated with said BCH codes;
   (b) calculating the quotient of $$\frac{S_3}{S_1},$$

(wherein $S_3$ is considered as $\alpha^a$ and $S_1$ is considered as $\alpha^b$) by using a Galois field table which is arranged in an anti-log and log format to enable a processing means to calculate said quotient by subtracting the log of $\alpha^b$ obtained from said Galois field table from the log of $\alpha^a$ obtained from said Galois field table to produce a resulting log which is used to obtain a resulting anti-log value A from said Galois field table;
   determining the number of errors within a data element by using the associated said $S_1$, $S_2$ and $S_3$ values; and
   using the $S_1$, $S_2$, $S_3$ values and the anti-log value A for determining therefrom the locations of a predetermined number of errors in a said data element.

16. A method of detecting errors in a data element including a data message and associated pseudo BCH codes wherein each said data message is comprised of a plurality of quintuples, with said quintuples having binary patterns wherein a binary pattern having more than two identical consecutive binary bits of a first kind within a quintuple is considered an error; said pseudo BCH codes being BCH codes which have been modified by the addition of binary bits of a second kind at predetermined locations in said BCH codes so as to make the format of said pseudo BCH codes correspond to said quintuples;
   said method comprising:
   examining each said data element to determine whether or not more than two identical consecutive bits of said first kind are found within a quintuple in said data message or the associated pseudo BCH codes;
   eliminating said binary bits of said second kind from said pseudo BCH codes to produce said BCH codes for the associated data message;
   generating from said data message and associated BCH codes for said data elements the $S_1$, $S_2$ and $S_3$ values associated with said BCH codes;
   calculating the quotient of $$\frac{S_3}{S_1},$$

(wherein $S_3$ is considered as $\alpha^a$ and $S_1$ is considered as $\alpha^b$) by using a Galois field table which is arranged in an anti-log and log format to enable a processing means to calculate said quotient by subtracting the log of $\alpha^b$ obtained from said Galois field table from the log of $\alpha^a$ obtained from said Galois field table to produce a resulting log which is used to obtain a resulting anti-log value A from said Galois field table;
   determining the number of errors within a data element by using the associated said $S_1$, $S_2$ and $S_3$ values; and
   using the $S_1$, $S_2$, $S_3$ values and the anti-log value A for determining therefrom the locations of a predetermined number of errors in a said data element.

* * * * *